United States Patent
Sasaki et al.

(10) Patent No.: US 7,332,254 B2
(45) Date of Patent: Feb. 19, 2008

(54) POSITIVE PHOTOSENSITIVE INSULATING RESIN COMPOSITION, CURED PRODUCT THEREOF, AND ELECTRONIC COMPONENT

(75) Inventors: Hirofumi Sasaki, Tokyo (JP); Atsushi Ito, Tokyo (JP); Hirofumi Goto, Tokyo (JP); Yuichi Hashiguchi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/465,671

(22) Filed: Aug. 18, 2006

(65) Prior Publication Data

US 2007/0042296 A1    Feb. 22, 2007

(30) Foreign Application Priority Data

Aug. 19, 2005    (JP) ............................. 2005-238853

(51) Int. Cl.
*G03F 7/023* (2006.01)
*G03F 7/30* (2006.01)

(52) U.S. Cl. ...................... 430/18; 430/191; 430/193; 430/280.1; 430/326; 430/330

(58) Field of Classification Search ................ 430/191, 430/192, 193, 280.1, 18, 326, 330
See application file for complete search history.

(56) References Cited

U.S. PATENT DOCUMENTS 5,362,597 A * 11/1994 Sano et al. ................. 430/191

| 2004/0094752 A1 | 5/2004 | Ito et al. ...................... 252/578 |
| 2004/0110084 A1* | 6/2004 | Inomata et al. ........... 430/270.1 |
| 2004/0126696 A1 | 7/2004 | Inomata et al. ........... 430/270.1 |
| 2006/0246371 A1* | 11/2006 | Nishikawa et al. ....... 430/270.1 |

FOREIGN PATENT DOCUMENTS

| JP | 05-005996 | 1/1993 |
| JP | 10-319592 | 12/1998 |
| JP | 11-237736 | 8/1999 |
| JP | 2000-098601 | 4/2000 |
| JP | 2004-191816 | 7/2004 |
| JP | 2004-206058 | 7/2004 |
| JP | 2004-258070 | 9/2004 |
| WO | WO 02/41079 A2 | 5/2002 |
| WO | WO 2005/052688 A2 | 6/2005 |

* cited by examiner

*Primary Examiner*—John S. Chu
(74) *Attorney, Agent, or Firm*—Oblon, Spivak, McClelland, Maier & Neustadt, P.C.

(57) ABSTRACT

Disclosed is a positive photosensitive insulating resin composition including:
(A) an alkali soluble resin,
(B) a compound having a quinonediazide group, and
(C) an epoxy resin having a softening point of not lower than 30° C.; and a cured product which is obtained by curing the composition.

The cured product obtained by curing the composition is excellent in resolution, electrical insulation, thermal shock resistance and adhesion, and exhibits reduced deformation after post-baking.

16 Claims, 3 Drawing Sheets

POSITIVE PHOTOSENSITIVE INSULATING RESIN COMPOSITION, CURED PRODUCT THEREOF, AND ELECTRONIC COMPONENT

FIELD OF THE INVENTION

The present invention relates to a positive photosensitive insulating resin composition which is used for an interlayer insulation film (passivation layer), an overcoat film, a buffer film or a planarized film of electronic components such as printed circuit boards, semiconductor devices and semiconductor packages, a cured product (insulator) formed by curing the composition, and an electronic component having the cured product.

BACKGROUND OF THE INVENTION

Conventionally, as an interlayer insulation film or the like used in semiconductor devices of electronics instruments, polyimide resins or polybenzoxazole resins have been widely used because of their excellent heat resistance and mechanical properties. In order to improve productivity or to obtain higher precision in film formation through providing resins with photosensitivity, various attempts have been made on photosensitive polyimide or photosensitive polybenzoxazole resins. For example, there has been commercialized a negative photosensitive resin in which a photo-crosslinkable group is incorporated into a polyimide precursor through ester boding or ionic bonding. Further, as a positive photosensitive resin, a composition that comprises a polyimide precursor and a quinonediazide compound is described in Japanese Patent Laid-open Publication Nos. 5996/1993 and 98601/2000 and the like. There is also described a composition that comprises a polybenzoxazole precursor and a quinonediazide compound in Japanese Patent Laid-open Publication No. 237736/1999. However, these systems still require improving resolution, electrical insulation, thermal shock resistance, adhesion, and other properties. These systems have problems such as thickness reduction (volume shrinkage) after curing, multi-stage baking on curing and atmosphere control on curing, so that it is pointed out that these systems cannot be easily handled in practical industrial application. In addition, there still have a problem that pattern shape changes before and after post-baking.

Various kinds of positive photosensitive resin compositions capable of improving various properties of cured products have been proposed. For example, Japanese Patent Laid-open Publication No. 206058/2004 (Patent document 1) discloses a positive photosensitive composition comprising an epoxy compound having two or more epoxy groups per one molecule, a compound generating a curing catalyst and a sulfonate ester, which is used as an underfill. It is described that a monomer which is in a liquid state at room temperature is suitable for the epoxy compound. Further, Japanese Patent Laid-open Publication No. 191816/2004 (Patent document 2) discloses a positive photosensitive composition which comprises a novolak resin, a quinonediazide compound, an epoxy compound having two or more epoxy groups per one molecule, and a compound generating acid or base. The composition is less hygroscopic and has higher reliability. It is described that there may cause problems in film properties after curing or pattern-forming performance such as solubility of exposed portions on development, when the blending ratio of the epoxy compound is too large or too small. Still further, in Japanese Unexamined Patent Publication No. 2004-258070 (Patent document 3) discloses a positive photo-resist composition which comprises a novolak resin, a quinonediazide compound, a specific compound that reacts with the novolak resin by action of an acid, and a compound that thermally generates an acid. This photo-resist composition provides an insulating film having reduced deformation of patterns when patterns are formed by heat curing. It is described that there may cause problems in film properties after curing or pattern-forming performance such as solubility of exposed portions on development, when the blending ratio of the specific compound is too large or too small.

However, in these documents, it is not described that the change in pattern shape before and after post-baking is affected by the kinds of epoxy resins used.

Patent document 1: Japanese Patent Laid-open Publication No. 206058/2004
Patent document 2: Japanese Patent Laid-open Publication No. 191816/2004
Patent document 3: Japanese Patent Laid-open Publication No. 258070/2004

SUMMARY OF THE INVENTION

It is an object of the present invention to solve the above-mentioned problems of the conventional art and to provide a positive photosensitive insulating resin composition capable of providing a cured product which exhibits reduced change in pattern shape after post-baking as well as excellent performance in resolution, electrical insulation, thermal shock resistance and adhesion, the resin composition which is suitably used for an interlayer insulation film, a passivation film, an overcoat film, a buffer film or a planarized film of electronic components such as printed circuit boards, semiconductor devices and semiconductor packages, or the like.

It is another object of the present invention to provide a cured product which exhibits reduced change in pattern shape after post-baking as well as excellent performance in resolution, electrical insulation, thermal shock resistance and adhesion, and is suitably used for an interlayer insulation film, passivation film, overcoat film, buffer film or a planarized film of electronic components such as printed circuit boards, semiconductor devices and semiconductor packages, or the like.

The present inventors found that by using a positive photosensitive insulating resin composition containing a specific epoxy resin, change in pattern shape after post-baking of a resultant cured product can be reduced, and completed the present invention.

The positive photosensitive insulating resin composition according to the present invention comprises:
(A) an alkali soluble resin,
(B) a compound having a quinonediazide group, and
(C) an epoxy resin having a softening point of not lower than 30° C.

As the alkali soluble resin (A), an alkali soluble resin (A1) having a phenolic hydroxyl group is preferable.

The positive photosensitive insulating resin composition preferably further comprises crosslinked fine particles (E).

Preferably, the number-average particle diameter of the crosslinked fine particles (E) is 30 to 500 nm, and at least one of the glass transition temperatures of the constituent polymers of the crosslinked fine particles (E) is not higher than 0° C.

Preferably in the positive photosensitive insulating resin composition, the amount of the compound (B) having a quinonediazide group is 5 to 50 parts by weight and the amount of the epoxy resin (C) having a softening point of not lower than 30° C. is 1 to 100 parts by weight based on 100 parts by weight of the total amount of the alkali soluble resin (A) and an optional phenolic compound (a).

The cured product of the present invention is obtained by curing the positive photosensitive insulating resin composition.

The electronic component of the present invention has the cured product, said electronic component being a printed circuit board, a semiconductor device or a semiconductor package.

Examples of the cured products include an interlayer insulation film, a passivation film, an overcoat film, a buffer film or a planarized film.

Using the positive photosensitive insulating resin composition according to the present invention can provide a cured product which exhibits reduced change in pattern shape before and after post-baking as well as excellent performance in resolution, electrical insulation, thermal shock resistance, and adhesion.

The cured product of the present invention exhibits reduced change in pattern shape before and after post-baking as well as excellent performance in resolution, electrical insulation, thermal shock resistance, and adhesion. The cured product is suitably used for an interlayer insulation film, a passivation film, an overcoat film, a buffer film or a planarized film of electronic components such as printed circuit boards, semiconductor devices and semiconductor packages, and others.

Further, the electronic component, such as the printed circuit board, the semiconductor device and the semiconductor package, of the present invention attains high reliability since it has a cured product which exhibits reduced change in pattern shape before and after post-baking as well as excellent performance in resolution, electrical insulation, thermal shock resistance and adhesion as, for example, an interlayer insulation film, a passivation film, an overcoat film, a buffer film or a planarized film.

Figure 1:
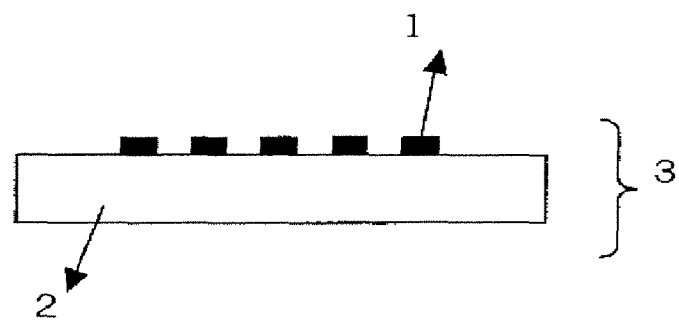
FIG. 1 is a cross sectional view of the evaluation substrate for testing of thermal shock resistance.

1: copper foil
2: substrate
3: evaluation substrate
4: copper foil
5: substrate
6: evaluation substrate
7: cured film
8: substrate

DESCRIPTION OF THE PREFERRED EMBODIMENTS

The positive photosensitive insulating resin composition, the cured product thereof, the electronic component according to the present invention will be specifically described below.

Positive Photosensitive Insulating Resin Composition

The positive photosensitive insulating resin composition according to the present invention comprises an alkali soluble resin (A), a compound (B) having a quinonediazide group, and an epoxy resin (C) having a softening point of not lower than 30° C. In addition, the positive photosensitive insulating resin composition of the present invention optionally contains, if necessary, other additives such as a phenolic compound (a), a cross-linking agent (D), a cross-linking auxiliary, crosslinked fine particles (E), an adhesion auxiliary (F), a solvent (G), a sensitizer, and a leveling agent.

(A) Alkali Soluble Resin:

The alkali soluble resin (A) used in the present invention may be, but not particularly limited thereto, a resin (A1) having a phenolic hydroxyl group [the following copolymer (A2) is excluded], a copolymer (A2) of a monomer having a phenolic hydroxyl group and an acrylic monomer, an acrylic resin (A3) [the above copolymer (A2) is excluded], and the like.

<(A1) Resin Having a Phenolic Hydroxyl Group>

Examples of the resin (A1) having a phenolic hydroxyl group include novolak resin. The novolak resin is obtained by condensing a phenol and an aldehyde in the presence of a catalyst. Examples of the phenol used here include phenol, o-cresol, m-cresol, p-cresol, o-ethylphenol, m-ethylphenol, o-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, and β-naphthol. Examples of the aldehyde include formaldehyde, paraformaldehyde, acetaldehyde, and benzaldehyde. Specific examples of the novolak resin include phenol/formaldehyde condensed novolak resin, cresol/formaldehyde condensed novolak resin, and phenol-naphthol/formaldehyde condensed novolak resin.

Further, examples of the resin (A1) having a phenolic hydroxyl group, other than novolak resins, include polyhydoxystyrene, copolymer of hydroxystyrene and another monomer, polyisopropenylphenol, copolymer of isopropenylphenol and another monomer, phenol-xylylene glycol condensed resin, cresol-xylylene glycol condensed resin, and phenol-dicyclopentadiene condensed resin.

<(A2) Copolymer of a Monomer Having a Phenolic Hydroxyl Group and an Acrylic Monomer>

In the copolymer (A2) of a monomer having a phenolic hydroxyl group and an acrylic monomer, examples of the monomer having a phenolic hydroxyl group include p-hydroxystyrene, m-hydroxystyrene, o-hydroxystyrene, p-isopropenylphenol, m-isopropenylphenol, and o-isopropenylphenol. The acrylic monomer is (meth)acrylic acid or a derivative thereof. Examples of the acrylic monomer specifically include (meth) acrylic acid and alkyl (meth) acrylates such as methyl (meth)acrylate, ethyl (meth)acrylate, isopropyl (meth)acrylate, n-butyl (meth)acrylate, sec-butyl (meth)acrylate, and t-butyl (meth)acrylate. In these alkyl (meth) acrylates, each hydrogen atom of the alkyl group may be substituted by a hydroxyl group. Further, besides the monomer having a phenolic hydroxyl group and the acrylic monomer, another monomer like styrene may be also copolymerized in the copolymer (A2).

(As) Hydroxystyrene-styrene Type Copolymers

The resin (A1) having a phenolic hydroxyl group or the copolymer (A2) of a monomer having a phenolic hydroxyl group and an acrylic monomer may also be a copolymer (hereinafter, referred as "hydroxystyene-styrene type copolymer (As)") which has a structural unit represented by the following formula (i) (hereinafter, referred as "structural unit (A-i)") and a structural unit represented by the following formula (ii) (hereinafter, referred as "structural unit (A-ii)").

The hydroxystyrene-styrene type copolymer (As) is a copolymer of a monomer capable of forming the structural unit (A-i) and a monomer capable of forming the structural unit (A-ii):

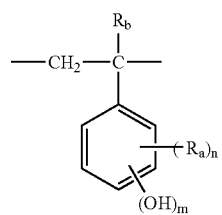

(j)

wherein $R_a$ represents an alkyl group having 1 to 4 carbon atoms, an alkoxy group having 1 to 4 carbon atoms, or an allyl group;

$R_b$ represents a hydrogen atom or a methyl group;

n is an integer of 0 to 3; and m is an integer of 1 to 3;

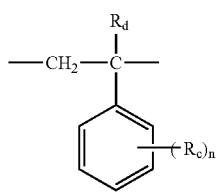

(ii)

wherein $R_c$ represents an alkyl group having 1 to 4 carbon atoms, an alkoxy group having 1 to 4 carbon atoms, or an allyl group;

$R_d$ represents a hydrogen atom or a methyl group; and n is an integer of 0 to 3.

Examples of the monomer capable of forming the structural unit (A-i) include p-hydroxystyrene, m-hydroxystyrene, o-hydroxystyrene, p-isopropenylphenol, m-isopropenylphenol, and o-isopropenylphenol. Among them, p-hydroxystyrene and p-isopropenylphenol are preferably used.

The structural unit (A-i) can be also obtained by polymerizing a monomer whose hydroxyl group is protected by for example, a t-butyl group, an acetyl group and the like. The protected structural unit in the resultant polymer or copolymer can be transformed into a hydroxystyrene type structural unit by a publicly known method, for example, by deprotecting in the presence of an acid catalyst.

Examples of the monomer capable of forming the structural unit (A-ii) include styrene, α-methylstyrene, o-methylstyrene, m-methylstyrene, p-methylstyrene, o-methoxystyrene, m-methoxystyrene, and p-methoxystyrene. Among these, styrene and p-methoxystyrene is preferable, and styrene is particularly preferable.

These monomers may be used singly or in combination of two or more kinds thereof.

In the hydroxystyrene-styrene type copolymer (As), may be also copolymerized a monomer capable of forming another structural unit (hereinafter, referred as "structural unit (A-iii)") other than the structural units (A-i) and (A-ii).

Exemplary monomer capable of forming the structural unit (A-iii) include compounds having alicyclic skeleton, unsaturated carboxylic acids or acid anhydrides thereof, esters of the unsaturated carboxylic acids, unsaturated nitriles, unsaturated imides, unsaturated alcohols, N-vinyl-ε-caprolactam, N-vinylpyrrolidone, N-vinylimidazole, and N-vinylcarbazole. More specifically, examples of the monomer include;

aforementioned acrylic monomers;

unsaturated carboxylic acids or acid anhydrides thereof such as the aforementioned acrylic monomers, (meth)acrylic acid, maleic acid, fumaric acid, crotonic acid, mesaconic acid, citraconic acid, itaconic acid, maleic anhydride, and citraconic anhydride;

esters such as methyl ester, ethyl ester, n-propyl ester, i-propyl ester, n-butyl ester, i-butyl ester, sec-butyl ester, t-butyl ester, n-amyl ester, n-hexyl ester, cyclohexyl ester, 2-hydroxyethyl ester, 2-hydroxypropyl ester, 3-hydroxypropyl ester, 2,2-dimethyl-3-hydroxypropyl ester, benzyl ester, isobornyl ester, tricyclodecanyl ester, and 1-adamantyl ester of the above-described unsaturated carboxylic acids;

unsaturated nitriles such as (meth)acrylonitrile, maleonitrile, fumaronitrile, mesaconitrile, citraconitrile, and itaconitrile;

unsaturated amides such as (meth) acrylamide, crotonamide, maleamide, fumaramide, mesaconamide, citraconamide, and itaconamide;

unsaturated imides such as maleimide, N-phenylmaleimide, and N-cyclohexylmaleimide;

compounds having alicyclic skeleton such as bicyclo[2.2.1]hept-2-ene (norbornene), tetracyclo[4.4.0.1$^{2,5}$.1$^{7,10}$]dodec-3-ene, cyclobutene, cyclopentene, cyclooctene, dicyclopentadiene, and tricyclo[5.2.1.0$^{2,6}$]decene;

unsaturated alcohols such as (meth) allyl; N-vinylaniline; vinylpyridines; N-vinyl-ε-caprolactam; N-vinylpyrrolidone; N-vinylimidazole; N-vinylcarbazole and the like.

These monomers may be used singly or in combination of two or more kinds thereof.

The content of the structural unit (A-i) in the hydroxystyrene-styrene type copolymer (As) is 10 to 99 mol %, preferably 20 to 97 mol %, more preferably 30 to 95 mol %. The content of the structural unit (A-ii) is 90 to 1 mol %, preferably 80 to 3 mol %, more preferably 70 to 5 mol %. Here, the total amount of the structural unit (A-i) and the structural unit (A-ii) is 100 mol %.

When the structural unit (A-iii) is contained in the hydroxystyrene-styrene type copolymer (As), the content of the structural unit (A-iii) is preferably 50 parts by weight or less, more preferably 25 parts by weight or less based on 100 parts by weight of the total amount of the structural unit (A-i) and the structural unit (A-ii).

When the hydroxystyrene-styrene type copolymer (As) is composed of the above-described structural units and the content of each structural unit is in the above-described range, the composition provides a cured product which is excellent in various properties such as resolution, electrical insulation, thermal shock resistance, and adhesion, particularly a cured product which is excellent both in electrical insulation and in thermal shock resistance.

For the hydroxystyrene-styrene type copolymer (As), the sequence of structural unit (A-i), structural unit (A-ii), and other structural unit (A-iii) is not particularly limited. The hydroxystyrene-styrene type copolymer (As) may be any of random copolymers and block copolymers.

The hydroxystyrene-styrene type copolymer can be obtained by polymerizing a compound capable of forming the structural unit (A-i) or the same compound whose hydroxyl group is protected, a monomer capable of forming the structural unit (A-ii), and, if necessary, a monomer capable of forming the structural unit (A-iii), in the presence of an initiator, in a solvent. The method of polymerization is not particularly limited. Radical polymerization or anionic polymerization is employed to obtain a compound having the molecular weight described below.

Usually, as the monomer capable of forming the structural unit (A-i), a monomer with a hydroxyl group protected is used. The monomer with a hydroxyl group protected is converted into a structural unit having a phenol ring after polymerization by deprotecting in a solvent in the presence of an acid catalyst such as hydrochloric acid and sulfuric acid at 50 to 150° C. for 1 to 30 hr.

<(A3) Acrylic Resin>

The acrylic resin (A3) may be a copolymer like the copolymer as described in Japanese Patent Laid-open Publication No. 319592/1998 (paragraphs 0011 to 0018), which is prepared from 10 to 40 wt % of a radical-polymerizable monomer having a carboxyl group (hereinafter, referred as "component (A3-1)"), 20 to 60 wt % of a radical-polymerizable monomer having a cycloalkyl group and no carboxylic group (hereinafter, referred as "component (A3-2)"), and 5 to 70 wt % of another radical-polymerizable monomer (hereinafter, referred as "component (A3-3)").

Examples of the component (A3-1) include;

monocarboxylic acids such as acrylic acid, methacrylic acid, and crotonic acid;

dicarboxylic acids such as maleic acid, fumaric acid, citraconic acid, mesaconic acid, and itaconic acid; and methacrylic acid derivatives having a carboxylic group and an ester bond, such as 2-succucinyloxyethyl methacrylate, 2-maleoyloxyethyl methacrylate, and 2-hexahydrophthaloyloxyethyl methacrylate.

Examples of the component (A3-2) include;

cyclohexyl (meth)acrylate, 2-methylcyclohexyl (meth)acrylate, dicyclopentanyloxyethyl (meth)acrylate, isobornyl (meth)acrylate, and dicyclopentanyl (meth)acrylate.

Examples of the component (A3-3) include;

alkyl (meth) acrylates such as methyl methacrylate, ethyl methacrylate, n-butyl (meth)acrylate, sec-butyl (meth)acrylate, t-butyl (meth)acrylate, and isopropyl (meth)acrylate;

aryl (meth)acrylates such as phenyl (meth)acrylate and benzyl (meth)acrylate;

dicarboxylic acid diesters (or unsaturated carboxylic acid diesters) such as dimethyl maleate, diethyl maleate, dimethyl fumarate, diethyl fumarate, dimethyl itaconate, and diethyl itaconate;

aromatic vinyl compounds such as styrene, α-methylstyrene, m-methylstyrene, p-methylstyrene, vinyltoluene, and p-methoxystyrene;

conjugated diolefins such as 1,3-butadiene, isoprene, and 1,4-dimethylbutadiene;

polymerizable compounds containing a nitrile group such as acrylonitrile and methacrylonitrile;

chlorine-containing polymerizable compounds such as vinyl chloride and vinylidene chloride;

polymerizable compounds containing an amide bond such as acrylamide and methacrylamide; and vinyl derivatives of a fatty acid such as vinyl acetate.

For any of the component (A3-1), the component (A3-2), and the component (A3-3), the compounds listed above may be used singly or in combination of two or more kinds thereof.

Among these alkali soluble resins, the resin (A1) having a phenolic hydroxyl group is preferable.

In the present invention, when the solubility of the alkali soluble resin (A) to alkaline solution is insufficient, a phenolic compound having low molecular weight (hereinafter, referred as "phenolic compound (a)") other than the alkali soluble resin (A) may be used together.

Examples of the phenolic compound (a) include 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, and 1,1,2,2-tetra(4-hydroxyphenyl)ethane.

These phenolic compounds (a) may be used in the range of preferably from 1 to 100 parts by weight, more preferably from 2 to 80 parts by weight, still more preferably from 3 to 50 parts by weight based on 100 parts by weight of the alkali soluble resin (A).

The polystyrene equivalent weight-average molecular weight (Mw) of the alkali soluble resin (A) which is measured with the gel permeation chromatography (GPC) is, for example, 200,000 or less, preferably 2,000 to 100,000, more preferably 5,000 to 20,000, from a viewpoint of resolution, thermal shock resistance, and heat resistance of the resultant insulating film.

In the composition of the present invention, the total content of the alkali soluble resin (A) and the phenol compound (a) is generally 40 to 95 parts by weight, preferably 50 to 80 parts by weight based on 100 parts by weight of the composition (solvent (G) is excluded). Within the above range of the ratio of the alkali soluble resin (A) and the optional phenol compound (a), the film formed from the resultant composition exhibits sufficient performance for development using an alkaline aqueous solution.

(B) Compound Having a Quinonediazide Group:

The compound having a quinonediazide group (hereinafter, referred as "quinonediazide compound (B)") used in the present invention is an ester between a compound having one or more phenolic hydroxyl groups and 1,2-naphthoquinonediazide-4-sulfonic acid or 1,2-naphthoquinonediazide-5-sulfonic acid. As the compound having one or more phenolic hydroxyl groups, although there is no particular limitation on it, compounds having the following structures are preferred.

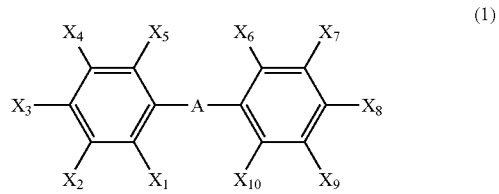

(1)

wherein $X_1$ to $X_{10}$, which may be different from or identical to each other, are each a hydrogen atom, an alkyl group having 1 to 4 carbon atoms, an alkoxy group having 1 to 4 carbon atoms, or a hydroxyl group provided, however, that at least one of $X_1$ to $X_5$ is a hydroxyl group; and A is a single bond, O, S, $CH_2$, $C(CH_3)_2$, $C(CF_3)_2$, $C=O$, or $SO_2$;

(2)

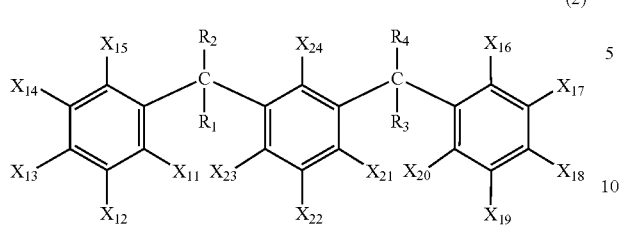

wherein $X_{11}$ to $X_{24}$, which may be different from or identical to each other, are as defined for the $X_1$ to $X_{10}$ provided, however, that at least one of $X_{11}$ to $X_{15}$ is a hydroxyl group; and $R_1$ to $R_4$ are each a hydrogen atom or an alkyl group having 1 to 4 carbon atoms;

(3)

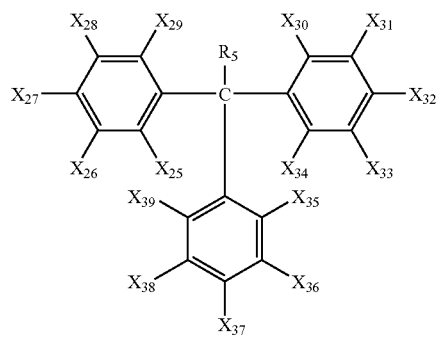

wherein $X_{25}$ to $X_{39}$, which may be different from or identical to each other, are as defined for the $X_1$ to $X_{10}$ provided, however, that at least one of $X_{25}$ to $X_{29}$ is a hydroxyl group and that at least one of $X_{30}$ to $X_{34}$ is a hydroxyl group; and $R_5$ is a hydrogen atom or an alkyl group having 1 to 4 carbon atoms;

(4)

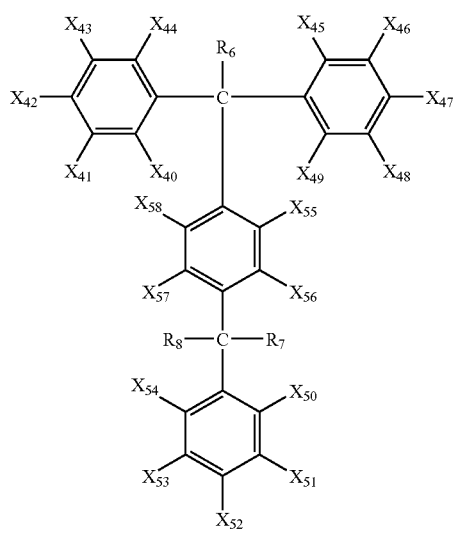

wherein $X_{40}$ to $X_{58}$, which may be different from or identical to each other, are as defined for the above $X_1$ to $X_{10}$ provided, however, that at least one of $X_{40}$ to $X_{44}$ is a hydroxyl group, that at least one of $X_{45}$ to $X_{49}$ is a hydroxyl group and that at least one of $X_{50}$ to $X_{54}$ is a hydroxyl group; and $R_6$ to $R_8$ are each a hydrogen atom or an alkyl group having 1 to 4 carbon atoms;

(5)

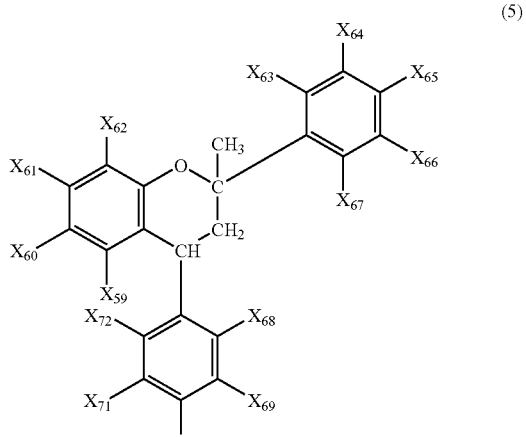

wherein $X_{59}$ to $X_{72}$, which may be different from or identical to each other, areas defined for the $X_1$ to $X_{10}$ provided, however, that at least one of $X_{59}$ to $X_{62}$ is a hydroxyl group and that at least one of $X_{63}$ to $X_{67}$ is a hydroxyl group.

Examples of the quinonediazide compound (B) include esters of either 1,2-naphthoquinonediazide-4-sulfonic acid or 1,2-naphthoquinonediazide-5-sulfonic acid with any of 4,4'-dihydroxydiphenylmethane, 4,4'-dihydroxydiphenyl ether, 2,3,4-trihydroxybenzophenone, 2,3,4,4'-tetrahydroxybenzophenone, 2,3,4,2',4'-pentahydroxybenzophenone, tris (4-hydroxyphenyl)methane, tris(4-hydroxyphenyl)ethane, 1,1-bis(4-hydoxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, and 1,1-bis(4-hydroxyphenyl)-1-[4-{1-(4-hydroxyphenyl)-1-methylethyl}phenyl]ethane.

The content of the quinonediazide compound (B) in the composition of the present invention is preferably 5 to 50 parts by weight, more preferably 10 to 40 parts by weight based on 100 parts by weight of the total amount of the alkali soluble resin (A) and the phenolic compound (a). When the content is less than 5 parts by weight, the retention percentage of film in non-photoexposed areas may be lowered and the image may not be obtained accurately as designed with a pattern mask. Meanwhile, when the content exceeds 50 parts by weight, the pattern shape may be deteriorated and the composition may foam during the curing process.

(C) Epoxy Resin:

The epoxy resin (C) having a softening point determined by the ring and ball method in accordance with JIS K7234-1986 (simply also called "softening point" in the present specification) of not lower than 30° C. which is used in the present invention (hereinafter, referred as "epoxy resin (C)") is not particularly limited. Examples of thereof include bisphenol A type epoxy, bisphenol F type epoxy, hydrogenated bisphenol A type epoxy, hydrogenated bisphenol F type epoxy, bisphenol S type epoxy, brominated bisphenol A type epoxy, biphenyl type epoxy, naphthalene type epoxy, fluorene type epoxy, spiro-ring type epoxy, bisphenol-alkane epoxy, phenol-novolak type epoxy, ortho-cresol-novolak type epoxy, brominated cresol-novolak type epoxy, trishydroxymethane type epoxy, tetraphenylolethane type epoxy, alicyclic type epoxy, and alcohol type epoxy, which have a softening point of not lower than 30° C. Commercially available ones are listed below by their trade names with softening points in parenthesis:

YDB-340 (40 to 55° C.), YDB-412 (125 to 140° C.), YDF-2001 (50 to 60° C.), and YDF-2004 (80 to 90° C.), produced by Tohto Kasei Co., Ltd.;

NC-3000-H (65 to 75° C.), EPPN-501H (51 to 57° C.), EOCN-1020 (52.5 to 82.0° C.), NC-7000L (83 to 93° C.), EPPN-201L (65 to 78° C.), XD-1000 (68 to 78° C.), and EOCN-4600 (60 to 68° C.), produced by Nippon Kayaku Co., Ltd.;

DENACOL EX-203 (85 to 87° C.), DENACOL EX-251 (163 to 167° C.), and DENACOL EX-711 (100 to 103° C.), produced by Nagase ChemteX Corporation;

Epicoat 1001 (64° C.), Epicoat 1007 (128° C.), Epicoat 1009 (144° C.), Epicoat 5050 (65° C.), Epicoat 5051 (105° C.), Epicoat 1031S (92° C.), Epicoat 180S65 (67° C.), Epicoat 157H70 (70° C.), and YX-315-75 (128° C.), produced by Japan Epoxy Resins Co., Ltd.;

EHPE3150 (75 to 95° C.), PLACCEL G402 (53 to 58° C.), PUE101 (35 to 45° C.), and PUE105 (35 to 45° C.), produced by Daicel Chemical Industries, Ltd.

The content of the epoxy resin (C) in the composition of the present invention is preferably 1 to 100 parts by weight, more preferably 2 to 80 parts by weight based on 100 parts by weight of the total amount of the alkali soluble resin (A) and the phenolic compound (a). When the content is less than 1 part by weight, open areas of pattern may be filled on post-baking. When the content exceeds 100 parts by weight, errors may take place in development.

The composition of the present invention may further contain an epoxy resin having a softening point lower than 30° C. in such an amount that the effects of the present invention may not be impaired (for example, 100 parts by weight or less based on 100 parts by weight of epoxy resin (C)).

(D) Cross-linking Agent:

The cross-linking agent (D) has a group which can react with the alkali soluble resin (A) or the epoxy resin (C). Examples of the cross-linking agent (D) include, but not particularly limited thereto, epoxy compounds (the epoxy resin (C) is excluded), nitrogen-containing compounds whose active methylol groups are completely or partially alkyl-etherified, isocyanate compounds or blocked compounds thereof, and oxetanes.

Specific examples of the cross-linking agent (D) include epoxy compounds such as epoxidized polybutadiene, bisphenol A type epoxy resin, bisphenol F type epoxy resin, naphthalene-based epoxy resin, fluorene-based epoxy resin, biphenyl type epoxy resin, glycidyl ester type epoxy resin, phenol-novolak resin type epoxy resin and the like (the epoxy resin (C) is excluded);

nitrogen-containing compounds derived by complete or partial alkyl-etherification of their active methylol groups from (poly)methylolated melamine, (poly)methylolated glycoluryl, (poly)methylolated benzoguanamine, (poly)methylolated urea or the like; more specifically hexa(methoxymethyl)melamine, hexa(butoxymethyl)melamine, tetra(methoxymethyl)glycoluryl, tetra(butoxymethyl)glycoluryl and the like;

isocyanate compounds such as tolylene diisocyanate and blocked compounds thereof;

oxetanes such as di[1-ethyl(3-oxetanyl)]methyl ether, 3-ethyl-3-{[3-(triethoxysilyl)propoxy]methyl}oxetane, oxetanylsilsesquioxane, phenol-novolak oxetane, and 1,4-bis{[(3-ethyl-3-oxetanyl)methoxy]methyl}benzene aromatic compounds having a hydroxyl group and an aldehyde group, such as o-hydroxybenzaldehyde; and aromatic compounds having two or more hydroxyl groups such as 2,6-bis(hydroxymethyl)-p-cresol.

Among these, preferred ones are nitrogen-containing compounds derived by complete or partial alkyl-etherification of their active methylol groups from (poly)methylolated melamine, (poly)methylolated glycoluryl, (poly)methylolated benzoguanamine, (poly)methylolated urea and the like.

These cross-linking agents (D) may be used singly or in combination of two or more kinds thereof.

The content of the cross-linking agent (D) in the composition of the present invention is preferably 1 to 100 parts by weight, more preferably 2 to 50 parts by weight based on 100 parts by weight of the total amount of the alkali soluble resin (A) and the phenolic compound (a). Within the above range of the content, the composition can provide a cured film excellent in resistance against chemicals and resolution.

When the composition of the present invention does not have sufficient curing performance, a cross-linking auxiliary may be used together. Examples of the cross-linking auxiliary include a compound having a group such as a glycidyl ether group, a glycidyl ester group, a glycidylamino group, a benzyloxymethyl group, a dimethylaminomethyl group, a diethylaminomethyl group, a dimethylolaminomethyl group, a diethylolaminomethyl group, a morpholinomethyl group, an acetoxymethyl group, a benzoyloxymethyl group, an acetyl group, a vinyl group, and an isopropenyl group.

These cross-linking auxiliary may be blended to such an extent that sufficient curing performance of the composition of the present invention may be assured and the purposes of the present invention may not be impaired. Specifically, the cross-linking auxiliary may be blended in the amount of 1 to 50 parts by weight based on 100 parts by weight of the cross-linking agent (D).

(E) Crosslinked Fine Particles:

The crosslinked fine particles (C) may be any particles provided that the polymer making up the particles has a Tg of not higher than 100° C. A preferable one is a copolymer of a crosslinkable monomer having two or more unsaturated polymerizable groups (hereinafter, referred as "crosslinkable monomer") and one or more kind of other monomer (hereinafter, referred as "other monomer (e)") which is (are) selected so that at least one of the $T_g$s of the crosslinked fine particles (E) may be not higher than 0° C. The other monomer (e) is preferably a monomer which has, as a functional group other than the polymerizable group, a functional group such as a carboxyl group, an epoxy group, an amino group, an isocyanato group, and a hydroxyl group.

The $T_g$ value of the crosslinked fine particles (E) refers to the glass transition temperature measured for a sample prepared by solidifying and drying a dispersion of the crosslinked fine particles on a DSC analyzer (SSC/5200H manufactured by Seiko Instruments Inc.) at the temperature elevation speed of 10° C./min in the range of from −100 to 150° C.

Examples of the crosslinkable monomer include a compound with plural polymerizable unsaturated groups such as divinylbenzene, diallyl phthalate, ethylene glycol di(meth)acrylate, propylene glycol di(meth)acrylate, trimethylolpropane tri(meth)acrylate, pentaerythrytol tri (meth) acrylate, polyethylene glycol di (meth) acrylate, and polypropylene glycol di(meth)acrylate. Among them, divinylbenzene is preferable.

The percentage of the crosslinkable monomer composed of the crosslinked fine particles (E) is preferably 1 to 20 wt %, more preferably 2 to 10 wt % based on the total amount of all the monomers used for copolymerization.

Examples of the other monomer (e) include:

diene compounds such as butadiene, isoprene, dimethylbutadiene, chloroprene, and 1,3-pentadiene;

unsaturated nitrile compounds such as (meth) acrylonitrile, α-chloroacrylonitrile, α-chloromethylacrylonitrile, α-methoxyacrylonitrile, α-ethoxyacrylonitrile, crotononitrile, cinnamonitrile, itaconodinitrile, maleodinitrile, and fumarodinitrile;

unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonamide, and cinnamamide;

(meth)acrylate esters such as methyl (meth)acrylate, ethyl (meth)acrylate, propyl (meth)acrylate, butyl (meth)acrylate, hexyl (meth)acrylate, lauryl (meth)acrylate, polyethylene glycol (meth) acrylate, and polypropylene glycol (meth) acrylate;

aromatic vinyl compounds such as styrene, α-methylstyrene, o-methoxystyrene, p-hydroxystyrene, and p-isopropenylphenol;

epoxy group-containing unsaturated compounds such as epoxy (meth)acrylates resulting from the reaction of diglycidyl ether of bisphenol A, diglycidyl ether of glycol, etc. with (meth)acrylic acid, hydroxyalkyl (meth)acrylate, etc., urethane (meth)acrylates resulting from the reaction of hydroxyalkyl (meth)acrylate with polyisocyanate, glycidyl (meth)acrylate, and (meth)acryl glycidyl ether;

unsaturated acid compounds such as (meth)acrylic acid, itaconic acid, β-(meth)acryloxyethyl succinate, β-(meth)acryloxyethyl maleate, β-(meth)acryloxyethyl phthalate, and β-(meth)acryloxyethyl hexahydrophthalate;

unsaturated compounds having an amino group, such as dimethylamino (meth) acrylate and diethylamino (meth) acrylate;

unsaturated compounds having an amide group, such as (meth)acrylamide and dimethyl(meth)acrylamide; and unsaturated compounds having a hydroxyl group, such as hydroxyethyl (meth)acrylate, hydroxypropyl (meth)acrylate, and hydroxybutyl (meth)acrylate.

Among these compounds, are preferably used butadiene, isoprene, (meth)acrylonitrile, alkyl (meth)acrylates, styrene, p-hydroxystyrene, p-isopropenylphenol, glycidyl (meth) acrylate, (meth)acrylic acid, hydroxyalkyl (meth)acrylates and the like.

Preferably, at least one kind of diene compound, specifically butadiene, is used as the other monomer (e). It is desirable that the diene compounds are used in an amount of 20 to 80 wt %, preferably 30 to 70 wt % based on all the monomers used in copolymerization. The crosslinked fine particles (E) can be obtained as rubber-like soft fine particles when the diene compound, as the other monomer (e), such as butadiene has been copolymerized in the above proportion based on the total amount of all the monomers. Further, the above amount of the different monomer leads to excellent crack resistance and durability of the resulting cured film. Further, it is preferred that styrene and butadiene are used together as the other monomer (e), in the point that a cured film having a low dielectric constant is obtained.

The crosslinked fine particles (E) has an average particle diameter of generally 30 to 500 nm, preferably 40 to 200 nm, more preferably 50 to 120 nm. For example, in the case where the particles (E) are synthesized by emulsion polymerization, the particle diameters can be controlled by, but not limited thereto, adjusting the amount of emulsifying agent to regulate the number of micells formed during the emulsion polymerization.

In the present invention, the average particle diameter of the crosslinked fine particles (E) refers to the value measured with a light scattering particle-size distribution analyzer LPA-3000 manufactured by Otsuka Electronics Co., Ltd., by diluting the dispersion of the crosslinked fine particles in a conventional manner.

The content of the crosslinked fine particles (E) is preferably 0.1 to 50 parts by weight, more preferably 1 to 20 parts by weight based on 100 parts by weight of the total amount of the alkali soluble resin (A) and the phenol compound (a) When the content is less than 0.1 part by weight, thermal shock resistance of the resultant cured film may not be improved, while when the content exceeds 50 parts by weight, heat resistance or miscibility (dispersability) with the other components may be lowered.

(F) Adhesion Auxiliary:

As the adhesion auxiliary (F), a functional silane coupling agent is preferable. Examples of the adhesion auxiliary (F) include a silane coupling agent having a reactive substituent such as a carboxyl group, a methacryloyl group, an isocyanato group, and an epoxy group. Specific examples thereof include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl) ethyltrimethoxysilane, and 1,3,5-N-tris (trimethoxysilylpropyl) isocyanulate.

The amount of the adhesion auxiliary (F) blended in the composition of the present invention is preferably 0.5 to 10 parts by weight, more preferably 0.5 to 5 parts by weight based on 100 parts by weight of the total amount of the alkali soluble resin (A) and the phenolic compound (a) Within the above range of the content, a cured product obtained by curing the composition of the present invention exhibits improved adhesion to base material.

(G) Solvent:

The solvent (G) is incorporated in the resin compositions to improve handling properties or to control the viscosity or storage stability of the compositions. Examples of the solvent (G) include, but not particularly limited thereto:

ethylene glycol monoalkyl ether acetates such as ethylene glycol monomethyl ether acetate and ethylene glycol monoethyl ether acetate;

propylene glycol monoalkyl ethers such as propylene glycol monomethyl ether, propylene glycol monoethyl ether, propylene glycol monopropyl ether, and propylene glycol monobutyl ether;

propylene glycol dialkyl ethers such as propylene glycol dimethyl ether, propylene glycol diethyl ether, propylene glycol dipropyl ether, and propylene glycol dibutyl ether;

propylene glycol monoalkyl ether acetates such as propylene glycol monomethyl ether acetate, propylene glycol monoethyl ether acetate, propylene glycol monopropyl ether acetate, and propylene glycol monobutyl ether acetate;

cellosolves such as ethyl cellosolve and butyl cellosolve;

carbitols such as butyl carbitol;

lactates such as methyl lactate, ethyl lactate, n-propyl lactate, and isopropyl lactate;

aliphatic carboxylates such as ethyl acetate, n-propyl acetate, isopropyl acetate, n-butyl acetate, isobutyl acetate, n-amyl acetate, isoamyl acetate, isopropyl propionate, n-butyl propionate, and isobutyl propionate;

other esters such as methyl 3-methoxypropionate, ethyl 3-methoxypropionate, methyl 3-ethoxypropionate, ethyl 3-ethoxypropionate, methylpyruvate, and ethyl pyruvate;

aromatic hydrocarbons such as toluene and xylene;

ketones such as 2-heptanone, 3-heptanone, 4-heptanone, and cyclohexanone;

amides such as N-dimethylformamide, N-methylacetamide, N,N-dimethylacetamide, and N-methylpyrrolidone; and lactones such as γ-butyrolactone.

These organic solvents may be used either singly or in combination of two or more kinds.

The content of the solvent (G) is generally 40 to 900 parts by weight, preferably 60 to 400 parts by weight based on 100 parts by weight of the total amount of the components contained in the composition other than the solvent.

The Other Additives:

The positive photosensitive insulating resin composition of the present invention may also contain an inorganic filler, a sensitizer, a leveling agent, an acid generating agent and the like, as the other additives, to such an extent that the properties of the composition of the present invention are not impaired.

(Method of Preparing Compositions)

The method of preparing the positive photosensitive insulating resin composition of the present invention is not particularly limited. Conventional preparation methods may be applied. In addition, the composition may be also prepared by a method wherein each component is put in a sample bottle, the bottle is sealed tightly with a plug, and the content is agitated on a wave rotor.

Cured Product and Electronic Component

The cured product according to the present invention is obtained by curing the above-described positive photosensitive insulating resin composition according to the present invention. Therefore, the cured product is excellent in properties such as resolution, thermal shock resistance, adhesion and electrical insulation, and further it is capable of reducing change in shape before and after post-baking. Consequently, the cured product of the present invention can be suitably used, in particular, as an interlayer insulation film, a passivation film an overcoat film, a buffer film or a planarized film for electronic components such as printed circuit boards, semiconductor devices and semiconductor packages. The electronic component, such as the printed circuit board, the semiconductor device and the semiconductor package, according to the present invention thus attains high reliability.

The cured product according to the present invention is excellent in electrical insulation. Its resistance value after migration test is $10^8 \Omega$ or higher, preferably $10^9 \Omega$ or higher, more preferably $10^{10} \Omega$ or higher. Here, the migration test in the present invention is specifically performed as follows.

Figure 3:
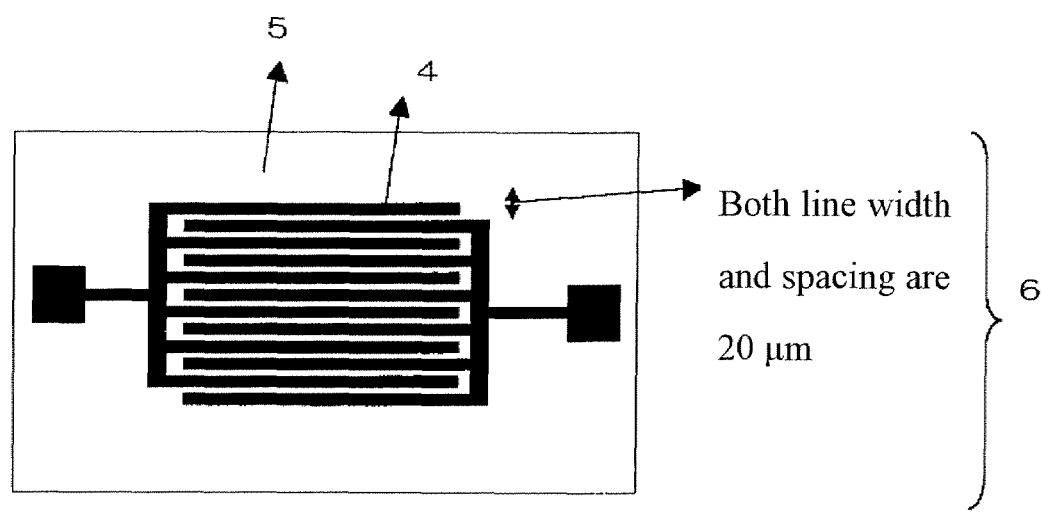
FIG. 3 is a schematic illustration of the evaluation substrate for testing of electrical insulation.

An evaluation substrate shown in FIG. 3 is coated with a resin composition and heated at 110° C. for 5 min on a hot plate to form a resin coating with a thickness of 10 μm on copper foil; the resin coating is cured by heating at 200° C. for 1 hr in a convection oven to form a cured film; the substrate with the cured film is put into a migration evaluation system (AEI, EHS-221MD manufactured by Tabai Espec Corp.) and treated for 200 hr at a temperature of 121° C., a humidity of 85%, a pressure of 1.2 atm, and an applied voltage of 5 V; and then the resistance value (in Ω) of the evaluation substrate is measured.

In addition, the cured product according to the present invention is excellent in thermal shock resistance. In a thermal shock test, where one temperature cycle is a temperature change between −65° C./30 min. and 150° C./30 min., the number of temperature cycles at which cracks are caused in the cured product is preferably 1,000 or more, more preferably 1,500 or more, further preferably 2,000 or more. Here, the thermal shock test in the present invention is specifically performed as follows.

Figure 2:
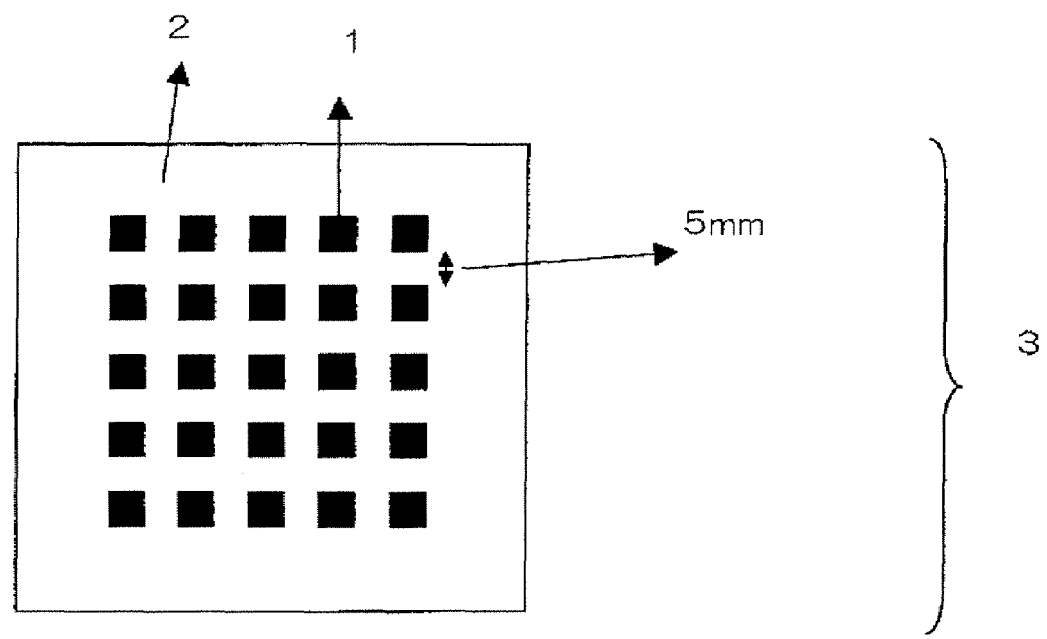
FIG. 2 is a schematic illustration of the evaluation substrate for testing of thermal shock resistance.

An evaluation substrate shown in FIGS. 1 and 2 is coated with a resin composition and heated at 110° C. for 5 min on a hot plate so as to form a resin coating with a thickness of 10 μm on copper foil; the resin coating is heated at 190° C. for 1 hr in an convection oven to obtain a cured film. The resultant substrate provided with the cured film is subjected to thermal shock resistance test, where one temperature cycle is a temperature change between −65° C./30 min. and 150° C./30 min., using a thermal shock chamber (TSA-40L manufactured by Tabai Espec Corp.). The number of temperature cycles at which defects such as cracks are caused in the cured film is determined by inspecting the film at every 100 cycles. Accordingly, a cured product which scores a larger number of temperature cycles at which defects such as cracks are developed is more excellent in thermal shock resistance.

The cured product of the present invention is prepared as follows: the positive photosensitive insulating resin composition according to the present invention is applied on a substrate such as a resin-coated copper foil, a copper-clad laminate, and a silicon wafer or alumina substrate having sputtered metal films; the coating is dried to evaporate the solvent and others, whereby a coating film is formed; the coating film is exposed to light through a desired pattern mask; the exposed portions are dissolved and removed by developing with an alkaline developer to obtain the desired pattern. The cured film is obtained by heating after the development for providing properties as an insulation film.

Examples of the method of coating the supporting material with the resin composition include a coating method such as dipping, spraying, bar coating, roll coating, and spin coating. The thickness of the coating can be controlled by adjusting the coating method and the concentration of the solid content or viscosity of the composition solution as appropriate.

Exemplary radiations employable for the above exposure include an ultraviolet ray, an electron beam and a laser beam emitted from a low-pressure mercury lamp, a high-pressure mercury lamp, a metal halide lamp, a g-line stepper and an i-line stepper. The dose can be appropriately determined in accordance with the radiation source used or the thickness of the resin film. In the case of ultraviolet rays radiated from high-pressure mercury lamps, the dose is about 1,000 to 50,000 J/m² for the film thickness of 10 to 50 μm.

Subsequently, the photo-exposed layer is developed with an alkaline developer to dissolve the photo-exposed area and remove it to form a desired pattern. Exemplary developing methods include shower development, spray development, immersion development and puddle development. The development is usually carried out at 20 to 40° C. for about 1 to 10 minutes.

Examples of the alkaline developer include alkaline aqueous solutions of about 1 to 10 wt % of an alkaline compound, such as of sodium hydroxide, potassium hydroxide, ammonia water, tetramethylammonium hydroxide and choline. The alkaline aqueous solution may be mixed with an appropriate amount of water-soluble organic solvent, such as methanol and ethanol, or a surfactant. The above development with the alkaline developer is followed by water washing and drying.

The formed pattern is then cured by heat treatment, so that the resulting cured film will fully function as an insulation film. The curing conditions are not particularly limited and depend on the objective use of the cured product; for example the film may be cured by heating at 50 to 250° C., preferably at 50 to 200° C. for 30 minutes to 10 hours.

It is also possible to carry out the heat treatment in two stages in order to effect the curing sufficiently or to avoid deformation of the resulting pattern. For example, the curing may be carried out in a manner such that the resultant pattern is heated at 50 to 120° C. for 10 min. to 2 hr in the first stage and further at 80 to 200° C. for 30 min. to 10 hr in the second stage.

With the above curing conditions, the heating may be conducted by a conventional oven, an infrared oven or the like.

EXAMPLES

The present invention will be further described in detail with reference to the following examples, but it should be construed that the invention is in no way limited to these examples. In the following examples and comparative examples, "part(s)" refers to "part(s) by weight" unless otherwise noted.

Each property of cured products is evaluated in a manner described below.

Resolution:

A 6-inch silicon wafer was spin-coated with a resin composition and heated at 110° C. for 5 min on a hot plate to obtain a uniform coating film of 20 μm thick. The coating film was irradiated with UV light from a high-pressure mercury lamp through a patterned mask using an aligner (MA-100 manufactured by Suss Microtec) so that the light exposure amounted to 8,000 J/m$^2$ at a wavelength of 350 nm, and then developed by immersing in an aqueous solution containing 2.38% by weight of tetramethylammonium hydroxide at 23° C. for 180 sec. After washed with ultra-pure water for 60 sec and air-dried, the coating film was observed with a microscope (MHL110 manufactured by Olympus Corporation) at a magnification of 200 times. The size of the smallest pattern among the patterns which correctly reproduced the original patterns of the mask used in exposure was referred to as resolution.

Adhesion:

A SiO$_2$-sputtered silicon wafer was coated with a resin composition and heated at 110° C. for 5 min to obtain a uniform resin coating film having a thickness of 10 μm. The resultant resin coating film was heated and cured at 200° C. for 1 hr in a convection oven to obtain a cured film. The cured film was subjected to pressure cooker test at a temperature of 121° C. and a humidity of 100%, under a pressure of 2.1 atm for 168 hr using a pressure cooker testing instrument (EHS-221MD manufactured by Tabai Espec Corp.). Adhesion of the cured film was evaluated through cross-cut test (grid tape test) in accordance with JIS K 5400-5-6 before and after the pressure cooker test.

Thermal-shock Resistance:

An evaluation substrate 3 for testing of thermal-shock resistance, which had patterned copper foil 1 on substrate 2 as shown in FIGS. 1 and 2, was coated with a resin composition and heated at 110° C. for 5 min on a hot plate to prepare an evaluation substrate provided with a resin coating having a thickness of 10 μm on copper foil 1. The resin coating was then heated and cured at 190° C. for 1 hr in a convection oven to give a cured film. This evaluation substrate was subjected to thermal shock test, where one temperature cycle was a temperature change between −65° C./30 min. and 150° C./30 min., with a thermal shock tester (TSA-40L manufactured by Tabai Espec Corp.). The number of temperature cycles at which any defects such as cracks were caused in the cured film was determined by observing the treated cured film with a microscope at a magnification of 200 times at every 100 cycles.

Electrical Insulation (Migration Test):

An evaluation substrate 6 for testing of electrical insulation, which had patterned copper foil 4 on substrate 5 as shown in FIG. 3, was coated with a resin composition and heated at 110° C. for 5 min on a hot plate to prepare an evaluation substrate provided with a resin coating having a thickness of 10 μm on copper foil 4. Then, the resin coating was heated and cured at 200° C. for 1 hr in a convection oven to give a cured film. This base material was put in a migration evaluation system (AEI, EHS-221MD manufactured by Tabai Espec Corp.) and treated at a temperature of 121° C. and a humidity of 85%, under a pressure of 1.2 atm, at an applied voltage of 5 V for 200 hr. After that, the resistance (Ω) of the evaluation substrate was measured to examine electrical insulation.

Figure 4:
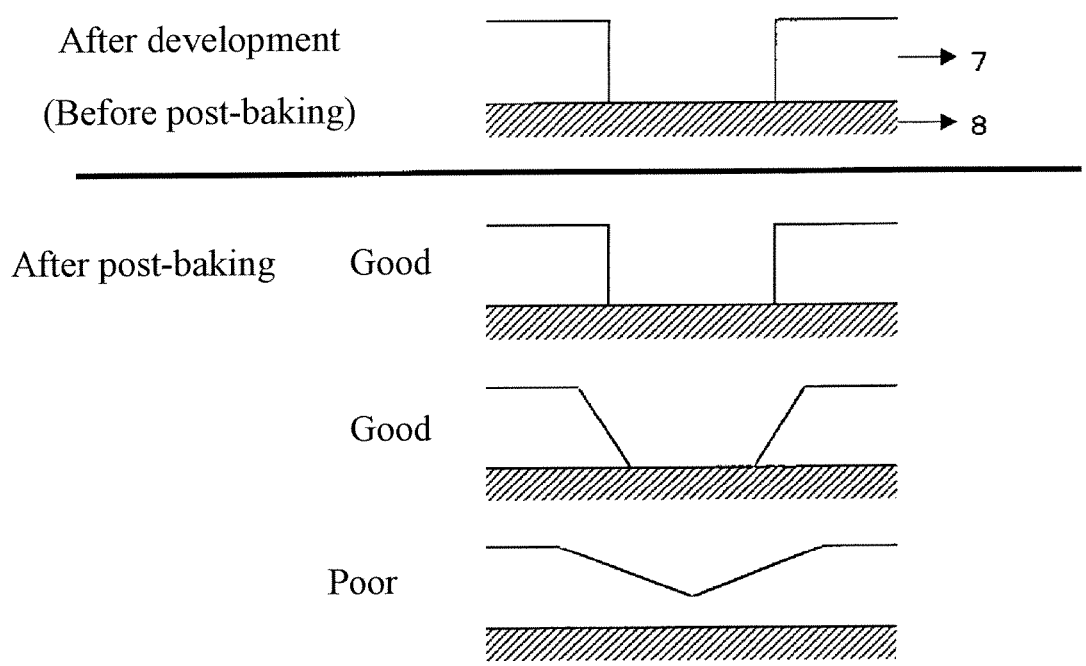
FIG. 4 is a schematic illustration of the cross-section of a pattern before and after post-baking.

Shape after Post-baking:

A 6-inch silicon wafer was spin-coated with a resin composition and heated at 110° C. for 5 min on a hot plate to obtain a uniform coating film of 20 μm thick. By using an aligner (MA-100 manufactured by Suss Microtec), the coating film was irradiated with UV light from a high-pressure mercury lamp through a pattern mask having a number of punch-out patterns having square shape with a side length of 5 μm, so that the dose was 8,000 J/m$^2$ at a wavelength of 350 nm. The exposed coating film was developed by being immersed in an aqueous solution containing 2.38 wt % of tetramethylammonium hydroxide at 23° C. for 180 sec. After washed with ultra-pure water for 60 sec and air-dried, the coating film was heated and cured at 200° C. for 1 hr in a convection oven to give a cured film. The cross sections of resultant punch-out patterns having square shape with a side length of 5 μm were observed with a scanning electron microscope (S4200 manufactured by Hitachi, Ltd.) at a magnification of 1,500 times. The pattern shape was evaluated based on the criteria shown in the figure to be referred (FIG. 4), in which "Good" indicates that the open areas of the patterns are not filled, that is, the patterns do not deform to such an extent that adjacent patterns are contacted to each other; "Poor" indicates that the open areas of patterns are filled, that is, adjacent patterns are contacted to each other by deformation of the patterns.

(Method for Determining Weight Average Molecular Weight)

Weight average molecular weights of copolymers were determined using a gel permeation chromatography system (Tosoh Corp., HLC-8220, column: TSKgel multipore $H_{XL}$-M, solvent: tetrahydrofuran, temperature: 40° C., flow rate: 1 mL/min.).

Synthesis Example 1

Synthesis of p-hydroxystyrene/styrene copolymer

A solution was prepared by dissolving 100 parts by weight, as the total amount, of p-t-butoxystyrene and styrene (molar ratio was p-t-butoxystyrene:styrene=80:20) in 150 parts by weight of propylene glycol monomethyl ether. This solution was kept under a nitrogen atmosphere at 70° C. for 10 hr with 4 parts by weight of azobisisobutyronitrile supplied to proceed polymerization. Then, sulfuric acid was added to the reaction solution, and the resultant solution was kept at 90° C. for 10 hr to covert the p-t-butoxystyrene unit into a hydroxystyrene unit through deprotection. Ethyl acetate was added to the obtained copolymer, the resultant solution was washed with water 5 times, the ethyl acetate phase was collected, and the solvent was removed to obtain p-hydroxystyrene/styrene copolymer (hereinafter, referred as "alkali soluble resin (A-1)").

The molecular weight of the alkali soluble resin (A-1) was measured by gel permeation chromatography. The weight average molecular weight (Mw) in terms of polystyrene was 10,000. $^{13}$C-NMR analysis showed that the molar ratio of the structural unit derived from p-hydroxystyrene and the structure unit derived from styrene was 80:20.

Synthesis Example 2

Synthesis of p-hydroxystyrene homopolymer

In a similar manner to Synthesis Example 1 except that 100 parts by weight of p-t-butoxystyrene only was dissolved in 150 parts by weight of propylene glycol monomethyl ether, p-hydroxystyrene (hereinafter, referred as "alkali soluble resin (A-2)") was obtained.

The molecular weight of the alkali soluble resin (A-2) was measured by gel permeation chromatography. The weight average molecular weight (Mw) in terms of polystyrene was 10,000.

Synthesis Example 3

Synthesis of p-hydroxystyrene/styrene/2-hydroxybutyl acrylate copolymer

In a similar manner to Synthesis Example 1 except that 100 parts by weight, as the total amount, of p-t-butoxystyrene, styrene, and 2-hydroxybutyl acrylate (molar ratio was p-t-butoxystyrene:styrene:2-hydroxybutyl acrylate=80:10:10) were dissolved in 150 parts by weight of propylene glycol monomethyl ether, p-hydroxystyrene/styrene/2-hydroxybutyl acrylate copolymer (hereinafter, referred as "alkali soluble resin (A-3)") was obtained.

The molecular weight of the alkali soluble resin (A-3) was measured by gel permeation chromatography. The weight average molecular weight (Mw) in terms of polystyrene was 10,000. $^{13}$C-NMR analysis showed that the molar ratio of the structural units, derived from p-hydroxystyrene, styrene, and 2-hydroxybutylacrylate respectively, was 80:10:10.

Synthesis Example 4

Synthesis of Cresol-novolak Resin

In accordance with conventional methods, m-cresol and p-cresol were mixed in a molar ratio of 60:40 (m-cresol:p-cresol), formalin was added to this mixture, condensation was carried out using oxalic acid as a catalyst to obtain cresol-novolak resin (hereinafter, referred as "alkali soluble resin (A-4)") having a weight average molecular weight (Mw) in terms of polystyrene of 6,500.

Synthesis Example 5

Synthesis of Quinonediazide Compound

A solution was prepared by dissolving 1 mol of 1,1-bis(4-hydroxyphenyl)-1-[4-[1-(4-hydroxyphenyl)-1-methylethyl]phenyl]ethane and 2.0 mol of 1,2-naphthoquinonediazide-5-sulfonyl chloride in dioxane with stirring. Then a flask containing this solution was immersed in a water bath whose temperature was controlled at 30° C. When the temperature of the solution became constant at 30° C., 2.0 mol of triethylamine was slowly added dropwise to this solution with a dropping funnel so that the temperature of the solution might not exceed 35° C. After that, precipitated triethylamine hydrochloride was removed by filtration, and the filtrate was poured into a large amount of dilute hydrochloric acid. The resultant precipitates were collected by filtration and dried overnight in a vacuum desiccator with a temperature controlled at 40° C. to obtain a quinonediazide compound (hereinafter, referred as "quinonediazide compound (B-1)").

Synthesis Example 6

Synthesis of Quinonediazide Compound

In a similar manner to Synthesis Example 5 except that 1 mol of 1,1-bis(4-hydroxyphenyl)-1-phenylethane and 1.5 mol of 1,2-naphthoquinonediazide-5-sulfonyl chloride were used as starting materials, a quinonediazide compound (hereinafter, referred to as "quinonediazide compound (B-2)") was obtained.

Example 1

As shown in Table 1, a resin composition was prepared by dissolving 100 parts by weight of alkali soluble resin (A-1), 20 parts by weight of quinonediazide compound (B-1), 10 parts by weight of solid epoxy resin (C-1), and 2.5 parts by weight of adhesion auxiliary (F-1) in 145 parts by weight of solvent (G-1). The properties of this composition were measured in accordance with the above-described evaluation method. The results are shown in Table 2.

Examples 2 to 8

Compositions were prepared from the components given in Table 1 in a similar manner to Example 1. The properties of the compositions and cured films thereof were measured in a similar manner as Example 1. The results are shown in Table 2.

Comparative Examples 1 to 4

Compositions were prepared from the components given in Table 1 in a similar manner to Example 1. The properties of the compositions and cured films thereof were measured in a similar manner as Example 1. The results are shown in Table 2.

TABLE 1

| | Alkali-soluble resin type/parts | Quinonediazide compound type/parts | Solid epoxy resin type/parts | Cross-linking agent type/parts | Additive type/parts | Adhesion auxiliary type/parts | Solvent type/parts |
|---|---|---|---|---|---|---|---|
| Example 1 | A-1/100 | B-1/20 | C-1/10 | — | — | F-1/2.5 | G-1/145 |
| Example 2 | A-4/100 | B-1/20 | C-2/25 | — | — | F-1/2.5 | G-2/145 |
| Example 3 | A-2/100 | B-1/20 | C-3/15 | D-1/25 | — | F-1/2.5 | G-1/145 |
| Example 4 | A-3/100 | B-2/20 | C-1/15 | D-2/10 | E-1/5 | F-1/2.5 | G-2/145 |
| Example 5 | A-3/100 | B-2/20 | C-1/15 | D-3/10 | E-2/5 | F-1/2.5 | G-2/145 |
| Example 6 | A-4/100 | B-1/20 | C-2/50 | — | — | F-1/2.5 | G-1/150 |
| Example 7 | A-4/100 | B-2/20 | C-1/15 C-5/5 | | E-1/5 | F-1/2.5 | G-2/145 |
| Example 8 | A-4/100 | B-2/20 | C-1/10 C-4/2 | D-3/10 | E-2/2 | F-1/2.5 | G-1/145 |
| Comp. Ex. 1 | A-1/100 | B-1/20 | C-4/35 | — | — | F-1/2.5 | G-1/145 |
| Comp. Ex. 2 | A-4/100 | B-1/20 | C-5/25 | — | — | F-1/2.5 | G-2/145 |
| Comp. Ex. 3 | A-1/100 | B-1/20 | — | D-1/25 | — | F-1/2.5 | G-1/145 |
| Comp. Ex. 4 | A-3/100 | B-2/20 | C-4/15 | D-2/10 | E-1/5 | F-1/2.5 | G-2/145 |

Note: The compositions described in Table 1 are as follows.

Alkali Soluble Resin;

A-1: p-hydroxystyrene/styrene copolymer with a molar ratio of 80/20 having a weight average molecular weight (Mw) in terms of polystyrene of 10,000;

A-2: polyhydroxystyrene having a weight average molecular weight (Mw) in terms of polystyrene of 10,000;

A-3: p-hydroxystyrene/styrene/2-hydroxybutyl acrylate copolymer with a molar ratio of 80/10/10 having a weight average molecular weight (Mw) in terms of polystyrene of 10,000;

A-4: cresol-novolak resin containing m-cresol and p-cresol with a molar ratio of 60/40 having a weight average molecular weight (Mw) in terms of polystyrene of 6,500;

Quinonediazide Compound;

B-1: condensate formed between 1,1-bis(4-hydroxyphenyl)-1-[4-[1-(4-hydroxyphenyl)-1-methylethyl]phenyl]ethane and 1,2-naphthoquinonediazide-5-sulfonic acid in a molar ratio of 1/2.0;

B-2: condensate formed between 1,1-bis(4-hydroxyphenyl)-1-phenylethane and 1,2-naphthoquinonediazide-5-sulfonic acid in a molar ratio of 1/1.5;

Epoxy Resin;

C-1: cresol-novolak type epoxy resin (trade name; EOCN-4600, Nippon Kayaku Co., Ltd.) having a softening point of 60 to 68° C.;

C-2: copolymer of phenyl glycidyl ether and dicyclopentadiene (trade name; XD-1000, Nippon Kayaku Co., Ltd.) having a softening point of 68 to 78° C.;

C-3: adduct of 1,2-epoxy-4-(2-oxiranyl)cyclohexane and 2,2-bis(hydroxymethyl)-1-butanol (EHPE3150, Daicel Chemical Industries, Ltd.) having a softening point of 75 to 95° C.;

C-4: propylene glycol diglycidyl ether (trade name; EPO-LIGHT 70P, Kyoeisha Chemical Co., Ltd.) having a softening point of not higher than 20° C.;

C-5: bisphenol A type epoxy resin (trade name; Epicoat 828, Japan Epoxy Resins Co., Ltd.) having a softening point of not higher than 20° C.;

Cross-linking Agent;

D-1: o-hydroxybenzaldehyde;

D-2: 2,6-bis(hydroxymethyl)-p-cresol;

D-3: hexa(methoxymethyl)melamine (trade name; NIKALAC MW-390, Sanwa Chemical Industry, Co., Ltd.);

Crosslinked Fine Particles;

E-1: butadiene/hydroxybutyl methacrylate/methacrylic acid/divinylbenzene=60/32/6/2 (wt %), average particle diameter=65 nm;

E-2: butadiene/styrene/hydroxybutyl methacrylate/methacrylic acid/divinylbenzene=60/20/12/6/2 (wt %), average particle diameter=65 nm;

Adhesion Auxiliary;

F-1: γ-glycidoxypropyltrimethoxysilane (trade name; A-187, Nippon Unicar Co., Ltd.);

Solvent;

G-1: ethyl lactate;

G-2: 2-heptanone

TABLE 2

| | Resolution (μm) | Adhesion before test | Adhesion after test | Thermal shock resistance (cycles) | Electrical insulation (Ω) | Shape after post-baking |
|---|---|---|---|---|---|---|
| Example 1 | 5 | 100/100 | 100/100 | 2,000 | $1 \times 10^{12}$ | Good |
| Example 2 | 10 | 100/100 | 100/100 | 2,000 | $1 \times 10^{12}$ | Good |
| Example 3 | 5 | 100/100 | 100/100 | 2,000 | $1 \times 10^{12}$ | Good |
| Example 4 | 5 | 100/100 | 100/100 | 2,200 | $1 \times 10^{12}$ | Good |
| Example 5 | 5 | 100/100 | 100/100 | 2,200 | $1 \times 10^{12}$ | Good |
| Example 6 | 10 | 100/100 | 100/100 | 2,000 | $1 \times 10^{12}$ | Good |
| Example 7 | 10 | 100/100 | 100/100 | 2,200 | $1 \times 10^{12}$ | Good |
| Example 8 | 10 | 100/100 | 100/100 | 2,200 | $1 \times 10^{12}$ | Good |
| Comp. Ex. 1 | 5 | 100/100 | 100/100 | 2,000 | $1 \times 10^{12}$ | Poor |

TABLE 2-continued

| | Resolution (μm) | Adhesion before test | Adhesion after test | Thermal shock resistance (cycles) | Electrical insulation (Ω) | Shape after post-baking |
|---|---|---|---|---|---|---|
| Comp. Ex. 2 | 5 | 100/100 | 100/100 | 2,000 | $1 \times 10^{12}$ | Poor |
| Comp. Ex. 3 | 5 | 100/100 | 100/100 | 2,000 | $1 \times 10^{12}$ | Poor |
| Comp. Ex. 4 | 5 | 100/100 | 100/100 | 2,200 | $1 \times 10^{12}$ | Poor |

INDUSTRIAL APPLICABILITY

The positive photosensitive insulating resin composition according to the present invention provides a cured product which is excellent in properties such as resolution, electrical insulation, thermal shock resistance and adhesion, and exhibits reduced deformation after post-baking. Therefore, the composition can provide a cured product with the afore-mentioned excellent properties which is used as an interlayer insulation film, a passivation film, overcoat film, buffer film or a planarized film for electronic components such as printed circuit boards, semiconductor devices and semiconductor packages; an electronic component such as a printed circuit board, semiconductor devices and semiconductor packages having the cured product; and the like.

What is claimed is:

1. A positive photosensitive insulating resin composition comprising:
   (A) an alkali soluble resin,
   (B) a compound having a quinonediazide group,
   (C) an epoxy resin having a softening point of not lower than 30°C.,
   (D) a cross-linking agent, and
   (a) an optional phenolic compound, wherein the amount of said epoxy resin (C) is 1 to 100 parts by weight and the amount of said cross-linking agent (D) is 2 to 50 parts by weight based on 100 parts by weigh of the total amount of said alkali soluble resin (A) and said phenolic compound (a).

2. The positive photosensitive insulating resin composition according to claim 1, wherein the alkali soluble resin (A) is a resin (A1) having a phenolic hydroxyl group.

3. The positive photosensitive insulating resin composition according to claim 1 or 2, which further comprises crosslinked fine particles (E).

4. The positive photosensitive insulating resin composition according to claim 3, wherein the crosslinked fine particles (E) have a number-average particle diameter of 30 to 500 nm and at least one of the glass transition temperatures of constituent polymers of the crosslinked fine particles (E) is not higher than 0° C.

5. The positive photosensitive insulating resin composition according to claim 1, wherein the amount of the compound (B) having the quinonediazide group is 5 to 50 parts by weight and the amount of the epoxy resin (C) having a softening point of not lower than 30° C. is 1 to 100 parts by weight based on 100 parts by weight of the total amount of the alkali soluble resin (A) and an optional phenolic compound (a).

6. A cured product obtained by curing the positive photosensitive insulating resin composition of claim 1.

7. A cured product obtained by curing the positive photosensitive insulating resin composition of claim 2.

8. A cured product obtained by curing the positive photosensitive insulating resin composition of claim 3.

9. An electronic component comprising the cured product of claim 6, said electronic component being a printed circuit board, a semiconductor device or a semiconductor package.

10. An electronic component comprising the cured product of claim 7, said electronic component being a printed circuit board, a semiconductor device or a semiconductor package.

11. An electronic component comprising the cured product of claim 8, said electronic component being a printed circuit board, a semiconductor device or a semiconductor package.

12. The electronic component according to claim 9, wherein the cured product is an interlayer insulation film, a passivation film, overcoat film, buffer film or a planarized film.

13. The electronic component according to claim 10, wherein the cured product is an interlayer insulation film, a passivation film, overcoat film, buffer film or a planarized film.

14. The electronic component according to claim 11, wherein the cured product is an interlayer insulation film, a passivation film, overcoat film, buffer film or a planarized film.

15. The positive photosensitive insulating resin composition according to claim 1, which further comprises an adhesion auxiliary (F).

16. A process for forming a cured product, comprising:
   (i) applying the positive photosensitive insulating resin composition of claim 1 on a substrate to form a coating film,
   (ii) exposing the coating film to light through a desired pattern mask,
   (iii) dissolving and removing the exposed portions by developing with an alkaline developer to obtain the desired pattern, and
   (iv) heating the obtained desired pattern.

* * * * *